(12) United States Patent
Liu

(10) Patent No.: US 6,304,072 B1
(45) Date of Patent: Oct. 16, 2001

(54) POINTER RESETTING MECHANISM FOR A MAGNET DISC OPERATED GAUGE

(75) Inventor: Paul Liu, 2F, No. 205, Sec. 2, Tiding Ave., Neihu, Taipei (TW)

(73) Assignees: Jimray Technology INC; Paul Liu, both of Taipei (TW)

( * ) Notice: Subject to any disclaimer, the term of this patent is extended or adjusted under 35 U.S.C. 154(b) by 0 days.

(21) Appl. No.: 09/492,815

(22) Filed: Jan. 28, 2000

(51) Int. Cl.[7] .............................. G01R 5/16; G01R 1/00; G01R 1/14
(52) U.S. Cl. .................................. 324/146; 324/154 PB; 73/430
(58) Field of Search ................................ 324/144, 146, 324/147, 150, 151 R, 151 A, 154 R, 154 PB, 155, 156; 73/866.1, 430; 116/284, 291; 335/222

(56) References Cited

U.S. PATENT DOCUMENTS

| 5,138,968 | * | 8/1992 | Ohike | 324/146 X |
| 5,146,158 | * | 9/1992 | Ooike | 324/146 |

FOREIGN PATENT DOCUMENTS

| 63-85366 | * | 4/1988 | (JP) | 324/146 |
| 4-69574 | * | 3/1992 | (JP) | 324/146 |
| 5142257 | * | 6/1993 | (JP) | 324/146 |

* cited by examiner

Primary Examiner—Gerard R. Strecker
(74) Attorney, Agent, or Firm—Browdy and Neimark

(57) ABSTRACT

A pointer resetting mechanism for a magnet disc operated gauge mainly adapted for use in vehicles is made up of a coil spring particularly housed together with a floatable magnet disc for protection in a sealed shelter case and at least an auxiliary magnet received in one of a tubular columns in a lower case of the shelter case. The spring has one end fixed to a pointer shaft and the other end secured to a retaining means disposed on the case. Around the sealed shelter case is wrapped around induction copper wires. When an electric current appears in the copper wires, the magnet disc floating in damping oil is forced by induced magnetism to rotate in the shelter case and when the electric current is removed the pointer can be automatically reset by way of the mechanical biasing force of the coil spring. Furthermore, the auxiliary magnet is used to make the pointer operate more stable at its initial position at where the coil spring can not produce enough tension to firmly hold the pointer in position. When the pointer is moved within or over a half circle range, the coil spring is extended in such a manner that it will produce larger tension to hold the pointer, the auxiliary magnet can constantly help the pointer to overcome the tension by attracting the magnet disc to spin clockwisely. When the pointer moves back to its initial position, the auxiliary magnet can also exert force on the magnet disc so as to help the pointer move smoothly backwards.

9 Claims, 7 Drawing Sheets

POINTER RESETTING MECHANISM FOR A MAGNET DISC OPERATED GAUGE

BACKGROUND OF THE INVENTION

The present invention relates to a pointer resetting mechanism for a magnet disc operated gauge mainly adapted for use in vehicles. Such a pointer resetting mechanism is made up of a coil spring particularly housed together with a floatable magnet disc for protection in a sealed shelter case and at least an auxiliary magnet received in one of a tubular columns in a lower case of the shelter case. The spring has one end fixed to a pointer shaft and the other end secured to a retaining means disposed on the case. Around the sealed shelter case is wrapped around induction copper wires. When an electric current appears in the copper wires, the magnet disc floating in damping oil is forced by induced magnetism to rotate in the shelter case and when the electric current is removed the pointer can be automatically reset by way of the mechanical biasing force of the coil spring. Furthermore, the auxiliary magnet is used to make the pointer operate more stable at its initial position at where the coil spring can not produce enough tension to firmly hold the pointer in position. When the pointer is moved within or over a half circle range, the coil spring is extended in such a manner that it will produce larger tension to hold the pointer, the auxiliary magnet can constantly help the pointer to overcome the tension by attracting the magnet disc to spin clockwisely. When the pointer moves back to its initial position, the auxiliary magnet can also exert force on the magnet disc so as to help the pointer move smoothly backwards.

Moreover, the sealed shelter case is full of damping oil in which the coil spring as well as the magnet disc is totally immersed The damping oil in the shelter case of a conventional gauge easily leaks out when a pointer shaft with a magnet disc spun in the damping oil back and forth for a long period of time as a result of pressure built up in a specific area. In the present invention, the coil spring is housed inside the shelter case and mounted onto a pointer shaft under protection and the coil spring having a plurality of concentric rings can effectively hold damping oil therein so that pressure built in the shelter case can be evenly distributed in practical operation without causing leakage in the shelter case.

There are a number of prior art pointer resetting means developed in these years which can make a pointer automatically resume to a starting position. However, they still have some disadvantages in consideration of structure and cost in production and maintenance.

Referring to FIGS. 1, 1A, the first prior art pointer resetting mechanism adopts a coil spring 6A secured to a front portion of a shaft 21A onto which a pointer 4A is mounted. Thereby the pointer 4A can be automatically reset to its initial position when a gauge stops functioning in operation. As further shown in FIG. 1A, the magnet disc 20A and the damping oil 30A are housed in a shelter case made up of an upper case 10A and a lower case 11A with the shaft 21A integrally secured to the magnet disc 20A. The coil spring 6A is fixed to the exposed front end, as shown in FIG. 1 so as to permit the shaft 21A to be retractably operated. Such a prior pointer resetting mechanism exposes the delicate coil spring 6A externally without any protection, it can be easily deformed or damaged in the process of assembly and maintenance.

As shown in FIG. 2, the second prior art is a gauge equipped with a coil operated pointer 4B wherein the magnetism producing coil 5B is movably mounted onto and operated along a C-shaped laminate 8B of plates which are subject to a strong magnetism produced by a magnet block 9B and a very light and fragile pointer 4B is secured to the coil 5B so that when an electric current is present in the magnetism producing coil 5B, the pointer 4B is able to give indication to marked numerals on a face board 7B for measurement of a certain functional property, such as pressure, speed and etc. Such a prior pointer system enables a pointer to be automatically reset by a tiny coil spring (not shown) fixed in front of the movable coil on the shaft as long as the electric current in the coil disappears. However, this gauge is extremely sensitive to vibration and the pointer is very light and delicate and is vulnerable to any external shock, vibration and impact. This prior gauge system with an automatic resetting pointer is not satisfactorily accepted as a result of its bulky size and vulnerability to damage.

In a third prior pointer resetting mechanism, a gear assembly is used. Such a gear assembly is complicated in structure, relatively bulky in size and expensive in cost, causing such a king of gauge to be less competitive in markets and harder for maintenance.

In a fourth prior pointer resetting mechanism, a step motor is mounted in a gauge so as to enable a pointer to reset to an initial position automatically. This kind of resetting mechanism is very expensive due to the high cost of a step motor which is delicate in structure and is easily out of function as a result of shock or collision. This type of pointer resetting mechanism is too expensive to be competitive in markets. So, such a prior art can not be widely accepted by consumers at all.

SUMMARY OF THE INVENTION

Therefore, the primary object of the present invention is to provide an improved pointer resetting mechanism which is simple in structure, cheap in cost and easy to maintain. Such a resetting mechanism adopts a coil spring which is protectively housed in a totally sealed shelter case so that the coil spring is free of any possible external damage.

Another object of the present invention is to provide an improved pointer automatic resetting mechanism for use in gauges of various kinds. The coil spring housed sealedly in a shelter case provides a biasing force for a pointer shaft so as to enable a pointer to be reset automatically by mechanical force when a gauge stops operation every time. Besides, the coil spring has a plurality of concentric rings which can effectively retain damping oil so as to alleviate the pressure built up in the shelter case when the pointer shaft is forced to spin, resulting in the prevention of leakage of damping oil in operation.

One further object of the present invention is to provide an improved pointer automatic resetting mechanism mainly adapted for gauges of vehicles or the like. At least one cylindrical auxiliary magnet is selectively housed in a receiving chamber defined in one hollow pole disposed around the shelter case whereby the magnet disc is magnetically influenced in such a manner that the pointer is helped to overcome the resilience force of the bias coil spring at the initial and final positions in operation. Thus the pointer can move in a smoother and more stable way in use.

DETAILED DESCRIPTION OF THE PREFERRED EMBODIMENT

Figure 1:
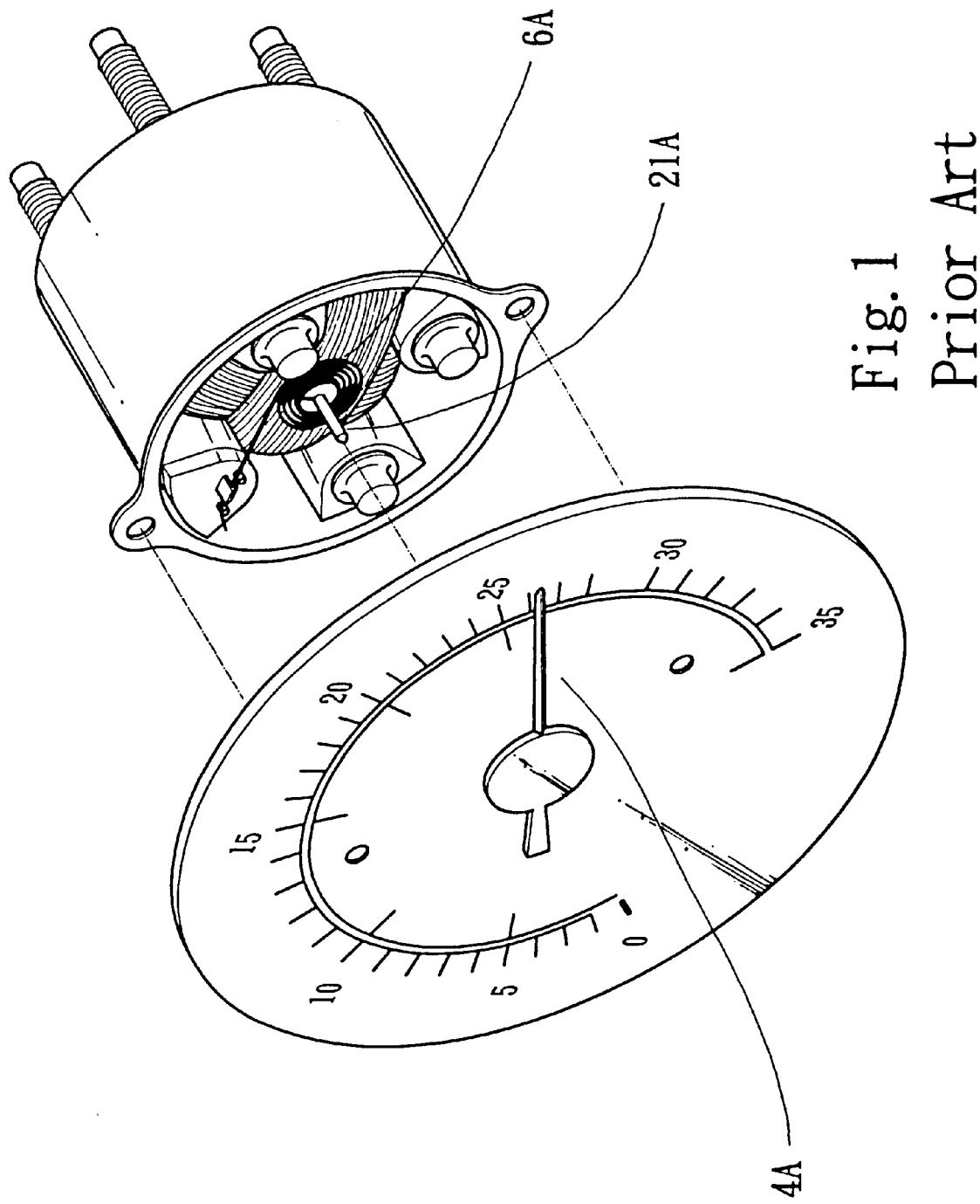
FIG. 1 is a diagram showing a prior art pointer resetting mechanism using an externally exposed coil spring.
Figure 1A:
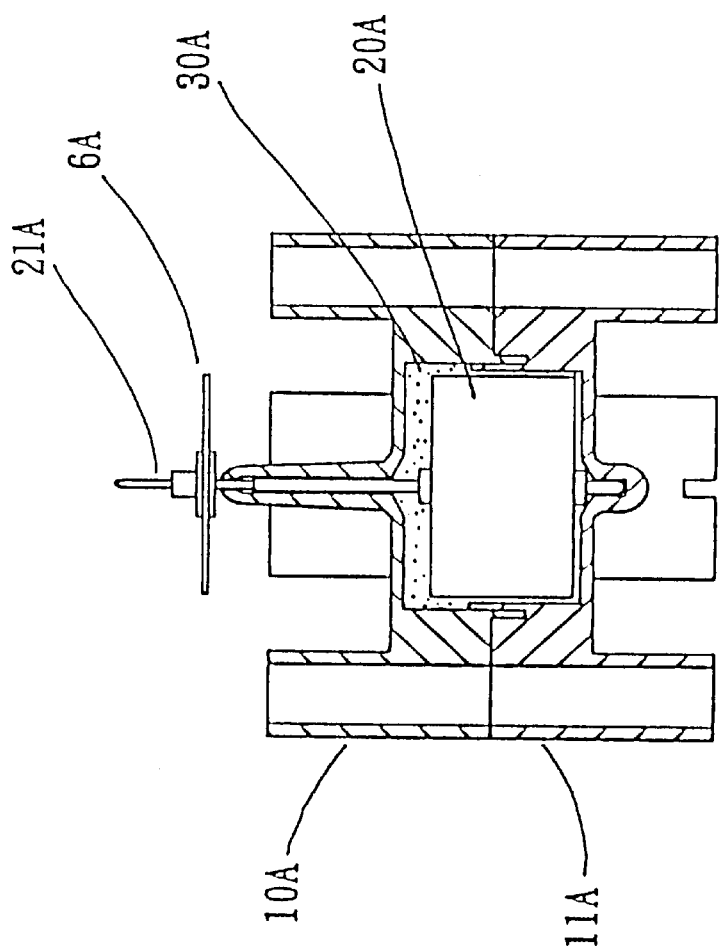
FIG. 1A is a sectional diagram showing the detailed structure of the prior art of FIG. 1.
Figure 2:
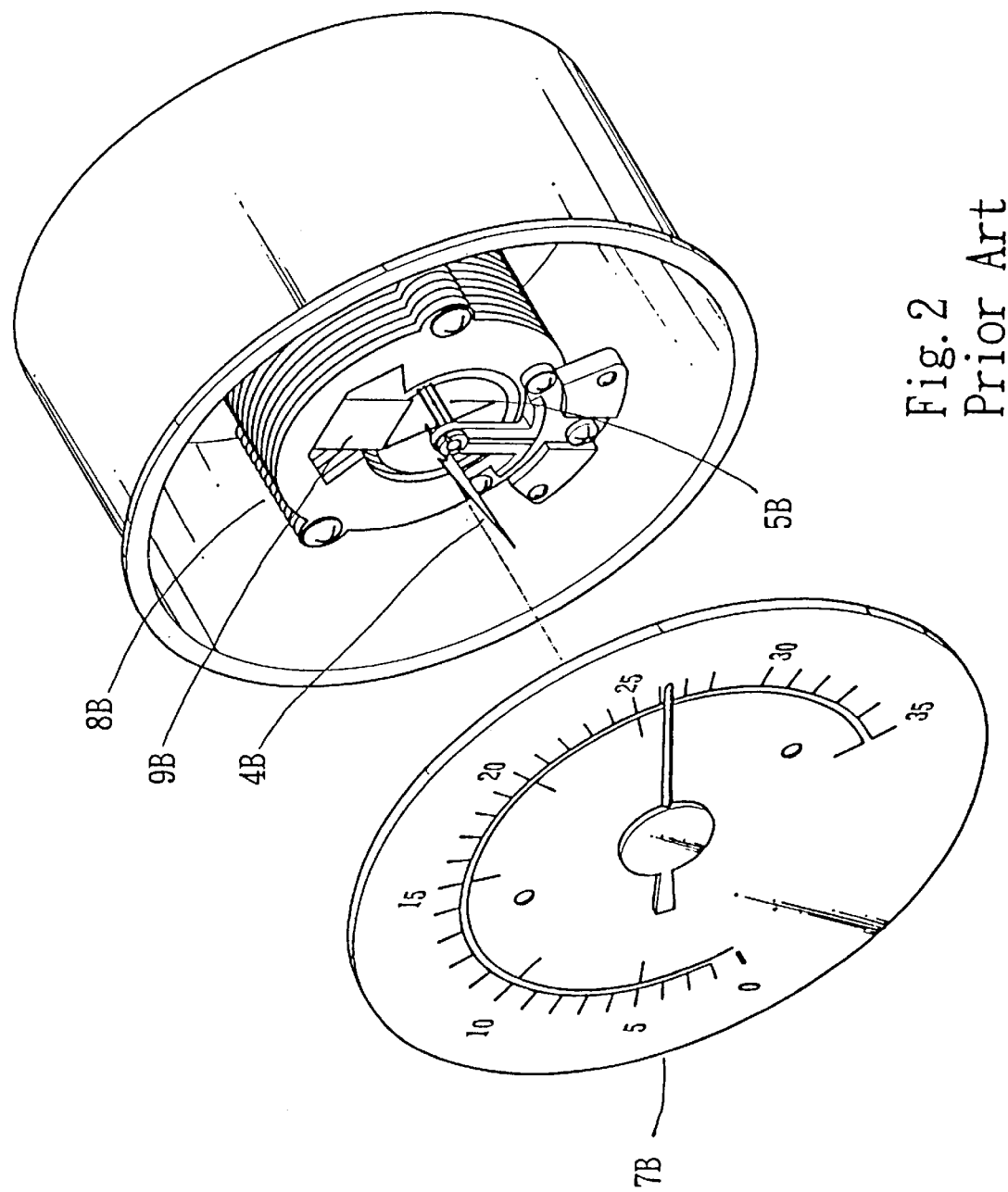
FIG. 2 is a diagram showing another gauge using an electrically drivable coil with a bias spring element exposed externally for retractably setting the coil.
Figure 3:
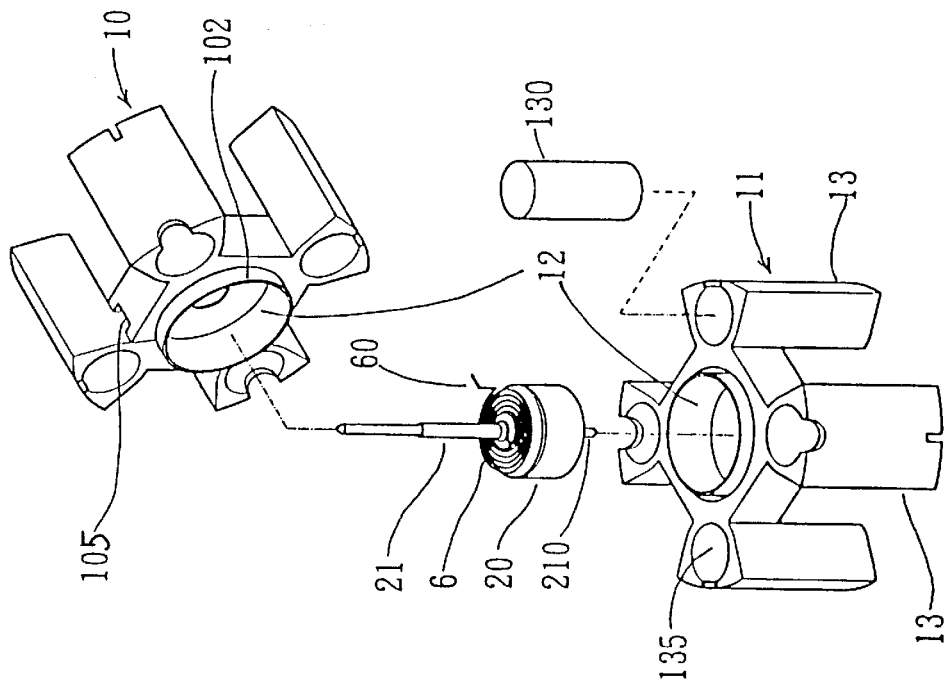
FIG. 3 is a perspective diagram showing the exploded components of the first embodiment of the present invention.
Figure 3A:
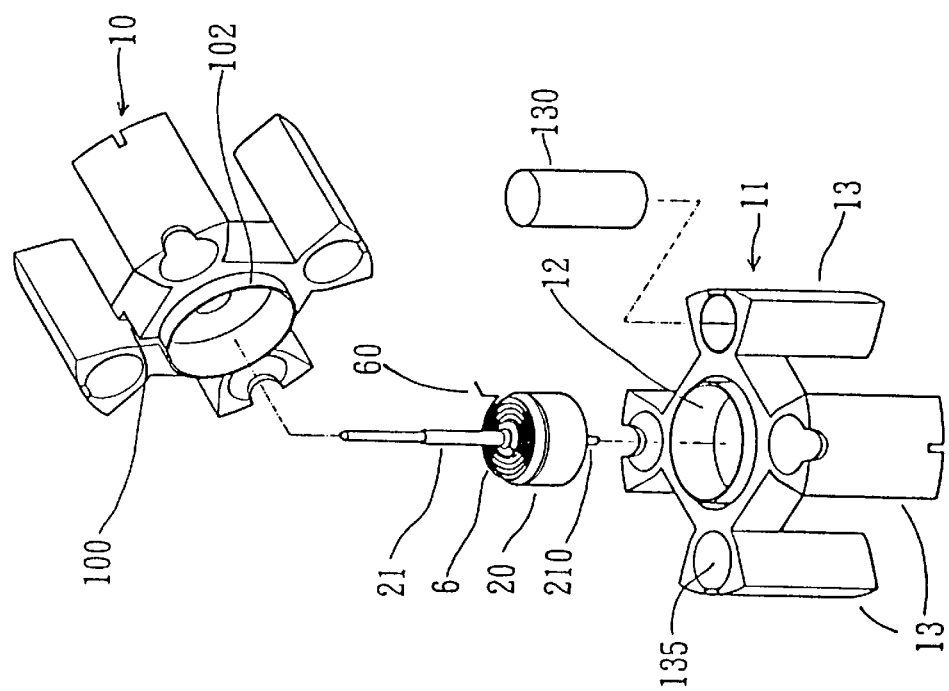
FIG. 3A is a perspective diagram showing the exploded components of the second embodiment of the present invention.

Referring to FIG. 3, in the present invention a pointer resetting mechanism for use in a magnet disc operated gauge of vehicles comprises a shelter case 1 having an upper case 10 and a lower case 11 with which the upper case 10 is integrally snapped into tight engagement with force.

A receiving chamber 12 is defined between the upper case 10 and the lower case 11 of the shelter case 1 so that a magnet disc 20 and damping oil 30 (see FIG. 5) can be placed therein The magnet disc 20 has a pointer shaft 21 going through a center thereof and is fixedly secured thereto integrally.

Figure 7:
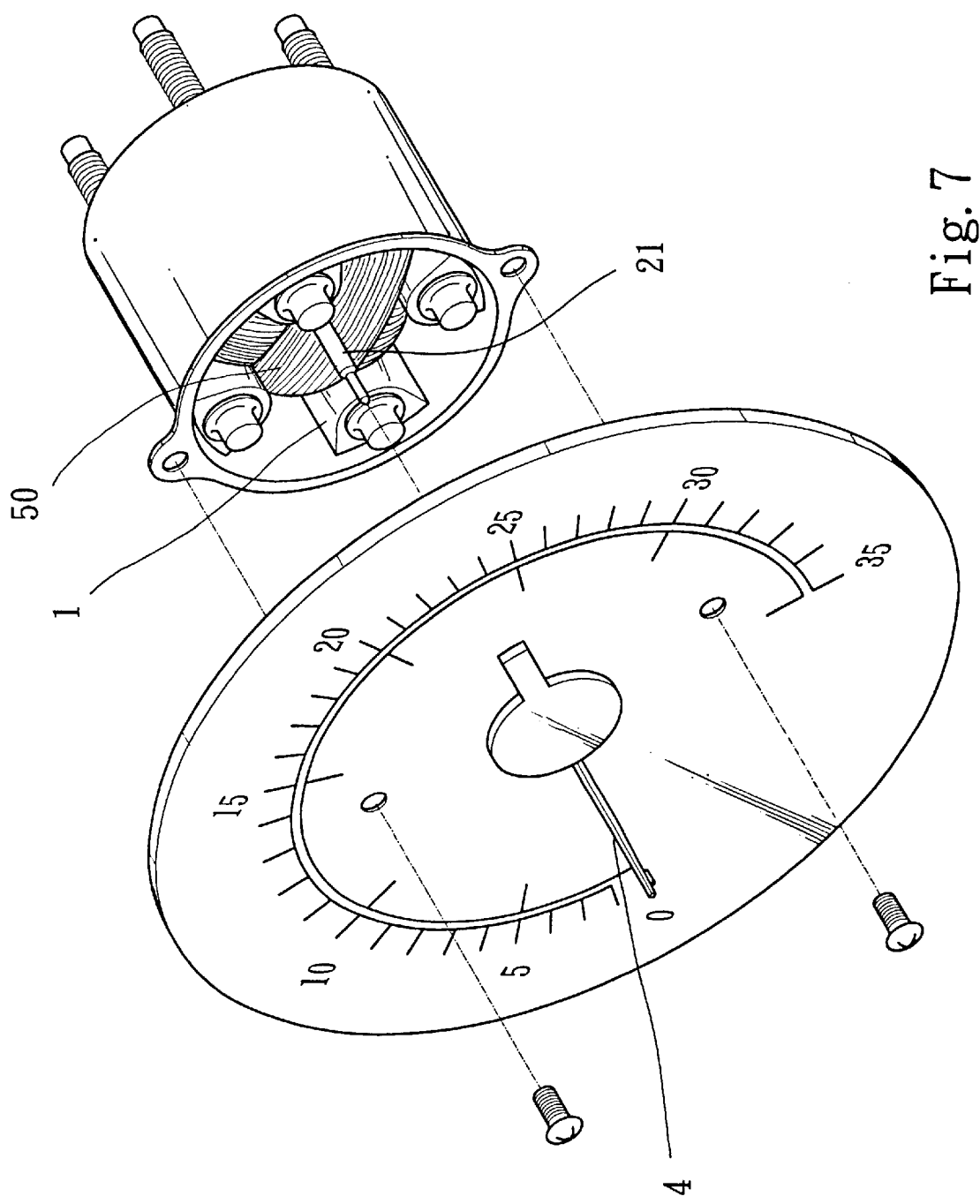
FIG. 7 is a diagram showing the shelter case wrapped around with induction copper wires and housed in an external gauge box to which a face board is attached.

An opening 105 is defined on the upper case 10 for passage of the pointer shaft 21 so that the pointer shaft 21 can be externally exposed with a pointer 4 fixedly mounted thereto outside of the shelter case 1, as shown in FIG. 7. The pointer shaft 21 and the magnet disc 20 are integrally combined together with a rear end 210 of the pointer shaft 21 which sticks out of the magnet disc 20 so that the same can be supported in place by engagement with a receiving bore 110 shown in FIG. 5 disposed at the center of the bottom of the lower case 11. The shelter case 1 made up of the upper case 10 and a lower case 11 has four hollow poles 13 disposed therearound. Each hollow pole 13 has a tubular receiving chamber 135. At least a cylindrical auxiliary magnet 130 is housed in a receiving chamber 135 so that it can exert magnetic force on the magnet disc 20 in operation.

Referring to FIG. 3, the cylindrical auxiliary magnet 130 is housed at least in one of the receiving chambers 135 of the hollow poles 13 has influence on the operation of the magnet disc 20 as well as the pointer shaft 21 which is integrally fixed to the magnet disc 20.

Figure 5:
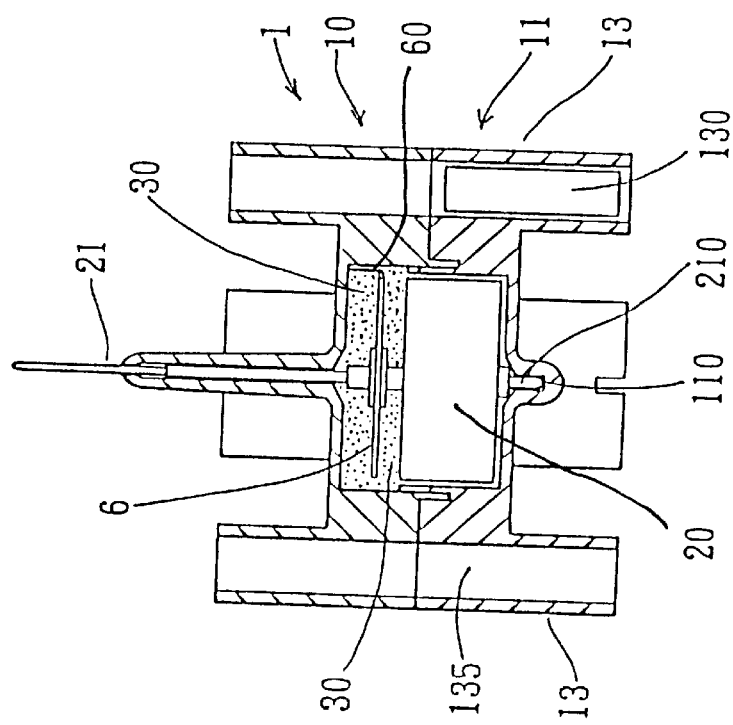
FIG. 5 is a sectional diagram showing the detailed structure of the pointer resetting mechanism of the present invention.

Referring further to FIG. 5, damping oil 30 is filled in the shelter case 1 for keeping the magnet disc 20 floating therein so as to permit the pointer shaft 21 to be smoothly rotated when the magnet disc 20 is activated by magnetism produced by current in induction copper wires 50 wrapped around the shelter case 1.

The pointer resetting mechanism of the present invention is characterized by a coil spring 6 having one end free 60 and another end secured to the pointer shaft 21 attached to the magnet disc 20 housed inside the chamber 12 of the shelter case 1 and immersed in the damping oil 30. The shelter case 1 is provided with a retaining means, such as a slot 100 105 for removably holding the free end 60 of the coil spring 6 and is tightly sealed so as to permit the magnet disc 20 and the coil spring 6 to be integrated inside the shelter case 1 with the pointer shaft 21 automatically reset to an initial point in a gauge by way of coil spring 6.

The pointer resetting mechanism of the present invention has a retaining means defined on the shelter case 1 for removably holding the free end 60 of the coil spring 6 so as to permit the pointer 4 secured to the pointer shaft 21 to be reset to its initial position by way of the bias force produced by the coil spring 6. As shown in FIGS. 3, 4, the retaining means is, in the illustrated first embodiment, just a slot 100 defined through a vertical flange 102 and a part of the upper shelter case 10. One end of the coil spring 6 is fixedly mounted onto the pointer shaft 21 and the opposite free end 60 is detachably engaged with the slot 100 in assembly; Furthermore, the open slot 100 is sealed by silicon in assembly whereby the coil spring 6 and the magnet disc 20 are integrally housed and totally immersed in the damping oil 30 in the shelter case 1 with the coil spring 6 biasedly movable.

Figure 4A:
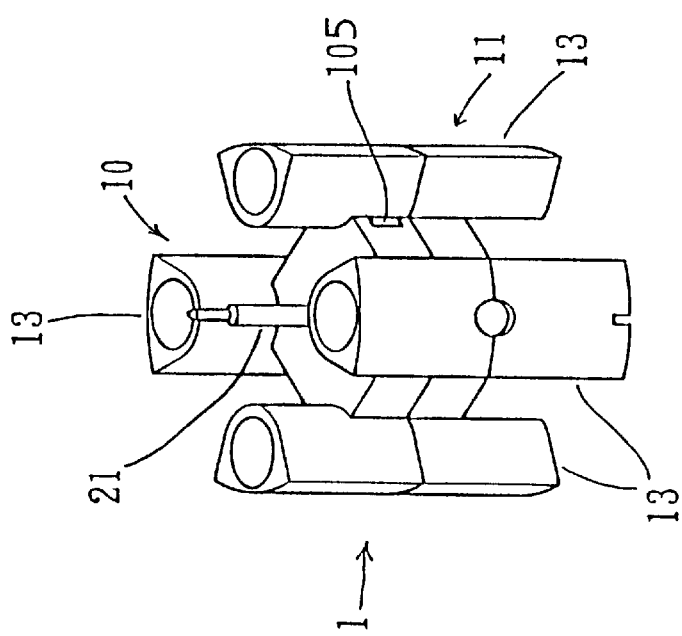
FIG. 4A is a diagram of the second embodiment showing the assembly of the shelter case with a magnet and a coil spring that are surrounded by damping oil.
Figure 4:
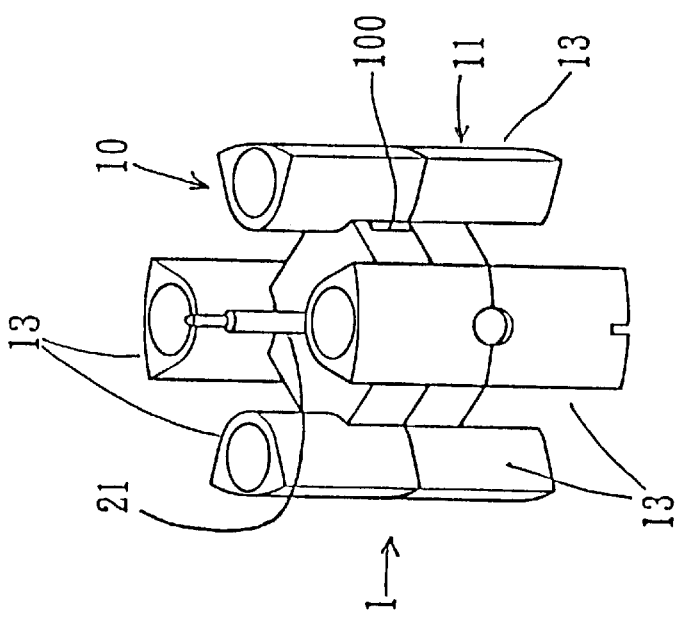
FIG. 4 is a diagram of the first embodiment showing the assembly of the shelter case with a magnet and a coil spring that are surrounded by damping oil.

In a second embodiment of the present invention, as shown in FIG. 4A, the retaining means to hold the free end 60 of the coil spring 6 can be a fixing hole 105 defined on the upper case 10. In assembly, before damping oil 30 is filled up in the chamber 12 of the shelter case 1, the fixing hole 105 with the free end 60 retained in place therein is stuffed with silicon so as to tightly seal the shelter case 1.

Figure 6:
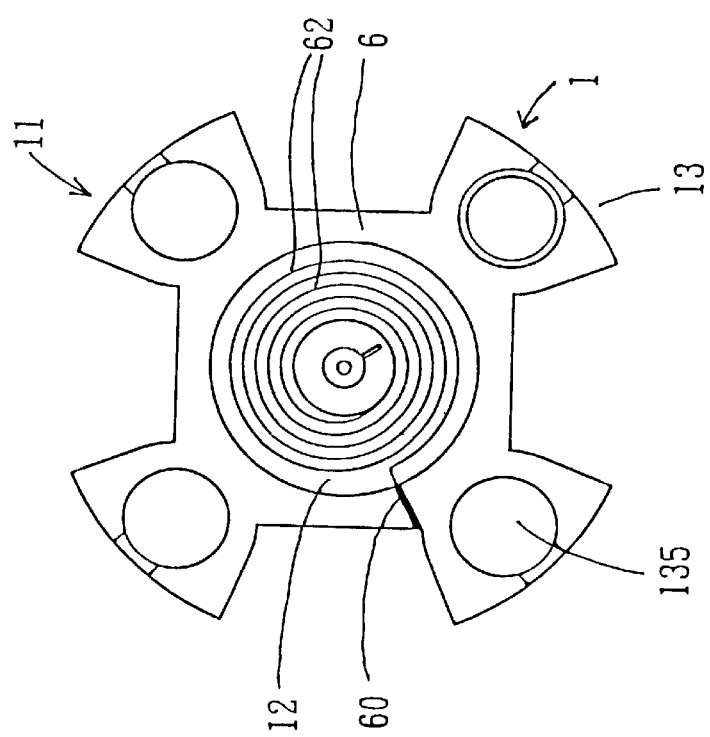
FIG. 6 is a diagram exposing the inner spring element of the present invention.

Moreover, as shown in FIG. 6 the pointer resetting mechanism of the present invention has a the coil spring 6 which is provided with a plurality of concentric rings 62 between which a small amount of the damping oil 30 is evenly distributed in such a manner that pressure built up in the sealed shelter case 1 as a result of rotation of the magnet disc 20 and the pointer shaft 21 is effectively reduced whereby damping oil 30 in the shelter case 1 is prevented from leaking out under pressure.

In summary, the simple structure of the pointer resetting mechanism of the present invention makes a common magnet disc operated gauge perform excellently in practical operation. The coil spring, totally immersed in damping oil makes a pointer reset smoothly in one aspect and the problem of leakage of damping oil in operation is also solved as a result of the reduction of internal pressure of the shelter case due to the existence of the coil spring. So, a gauge with a pointer automatic resetting mechanism can be mass produced at a low price and its operation life is effectively prolonged due to the placement of a coil spring.

I claim:

1. A pointer resetting mechanism for use in a magnet disc operated gauge of vehicles, comprising a shelter case having an upper case and a lower case, a magnet disc, damping oil and a bias coil spring; wherein:

said upper case and said lower case are snapped into tight engagement with each other to form said shelter case;

a plurality of hollow poles are disposed around said shelter case and each said hollow pole has a receiving chamber;

a chamber is defined between said upper and said lower case of said shelter case for housing said magnetic disc, said coil spring and said damping oil;

said magnet disc has a pointer shaft going through a center thereof and fixedly secured thereto;

an opening is defined on said upper case for passage of said pointer shaft;

said damping oil sealedly filled in said shelter case for keeping said magnet disc totally immersed therein so as to permit said pointer shaft to be smoothly rotated in operation;

a pointer is fixedly secured to said pointer shaft which sticks out of said upper case of said shelter case;

induction copper wires are wrapped around said sealed shelter case so as to magnetically influence said magnet disc as long as electric current is present in said copper wires;

whereby said coil spring having one end free and another end secured to said pointer shaft which is attached to said magnet disc is housed inside said shelter case and immersed in said damping oil; said shelter case is provided with a retaining means for removably holding said free end of said coil spring and is tightly sealed so as to permit said magnet disc and said coil spring to be integrated inside said shelter case with said pointer shaft automatically reset in a smooth manner to an initial point in a gauge by way of said coil spring.

2. The pointer resetting mechanism as claimed in claim 1 wherein said retaining means of said shelter case is a slot defined on a vertical flange of said upper shelter case and one free end of said coil spring fixedly mounted onto said pointer shaft is detachably engaged with said slot in assembly; and said open slot is sealed by silicon in assembly whereby said coil spring and said magnet disc are integrally housed and totally immersed in said shelter case.

3. The pointer resetting mechanism as claimed in claim 1 wherein said retaining means of said shelter case is a fixing hole defined on said flange of said upper shelter case and one free end of said coil spring fixedly mounted onto said pointer shaft is detachably engaged with said fixing hole in assembly; and said fixing hole is sealed by silicon in assembly whereby said coil spring and said magnet disc are integrally housed in said shelter case.

4. The pointer resetting mechanism as claimed in claim 1 wherein said coil spring is provided with a plurality of concentric rings among which said damping coil is evenly distributed in such a manner that pressure built up in said shelter case as a result of rotation of said magnet disc and said pointer shaft is effectively reduced whereby damping oil in said shelter case is prevented from leaking out under pressure.

5. The pointer resetting mechanism as claimed in claim 1 wherein at least one cylindrical auxiliary magnet is house in said receiving chamber of said hollow poles disposed around said shelter case whereby said magnet disc housed in said chamber defined by said upper case and said lower case of said shelter case is magnetically influenced by said cylindrical auxiliary magnet in such a manner that said pointer mounted to said magnet disc operates in a smoother and more stable way in combination with said bias coil spring.

6. A pointer resetting mechanism for use in a magnet disc operated gauge of vehicles, comprising a shelter case having an upper case and a lower case, a magnet disc, damping oil and a bias coil spring and at least one cylindrical auxiliary magnet; wherein:

said upper case and said lower case are snapped into tight engagement with each other to form said shelter case;

said shelter case having a plurality of hollow poles disposed therearound, each having a receiving chamber;

at least one cylindrical auxiliary magnet being housed in said receiving chambers of said hollow poles in such a manner that said auxiliary magnet having magnetic influence on said magnet disc, helping said pointer operate more stable at an initial position where said coil spring is not extended and at its final position where said coil spring is partially or fully extended;

a chamber is defined between said upper and said lower case of said shelter case for housing said magnetic disc, said coil spring and said damping oil;

said magnet disc has a pointer shaft going through a center thereof and fixedly secured thereto;

an opening is defined on said upper case for passage of said pointer shaft;

said damping oil sealedly filled in said shelter case for keeping said magnet disc totally immersed therein so as to permit said pointer shaft to be smoothly rotated in operation, a pointer is fixedly secured to said pointer shaft which sticks out of said upper case of said shelter case;

induction copper wires are wrapped around said sealed shelter case so as to magnetically influence said magnet disc as long as electric current is present in said copper wires;

whereby said coil spring having one end free and another end secured to said pointer shaft which is attached to said magnet disc is housed inside said shelter case and immersed in said damping oil; said shelter case is provided with a retaining means for removably holding said free end of said coil spring and is tightly sealed so as to permit said magnet disc and said coil spring to be integrated inside said shelter case with said pointer shaft automatically reset with the help of at least one said cylindrical auxiliary magnet in a smooth manner to an initial point in a gauge by way of said coil spring.

7. The pointer resetting mechanism as claimed in claim 6 wherein said retaining means of said shelter case is a slot defined on a vertical flange of said upper shelter case and one free end of said coil spring fixedly mounted onto said pointer shaft is detachably engaged with said slot in assembly; and said open slot is sealed by silicon in assembly whereby said coil spring and said magnet disc are integrally housed and totally immersed in said shelter case.

8. The pointer resetting mechanism as claimed in claim 6 wherein said retaining means said shelter case is a fixing hole defined on said flange of said upper shelter case and one free end of said coil spring fixedly mounted onto said pointer shaft is detachably engaged with said fixing hole in assembly; and said fixing hole is sealed by silicon in assembly whereby said coil spring and said magnet disc are integrally housed in said shelter case.

9. The pointer resetting mechanism as claimed in claim 6 wherein said coil spring is provided with a plurality of concentric rings among which said damping coil is evenly distributed in such a manner that pressure built up in said shelter case as a result of rotation of said magnet disc and said pointer shaft is effectively reduced whereby damping oil in said shelter case is prevented from leaking out under pressure.

* * * * *